US008310138B2

(12) United States Patent
Nagai et al.

(10) Patent No.: US 8,310,138 B2
(45) Date of Patent: Nov. 13, 2012

(54) ACTUATOR

(75) Inventors: Nobuyuki Nagai, Kanagawa (JP); Masayuki Sugasawa, Chiba (JP); Kazuomi Murakami, Aichi (JP)

(73) Assignee: Sony Corporation, Tokyo (JP)

( * ) Notice: Subject to any disclaimer, the term of this patent is extended or adjusted under 35 U.S.C. 154(b) by 312 days.

(21) Appl. No.: 12/727,844

(22) Filed: Mar. 19, 2010

(65) Prior Publication Data

US 2010/0244634 A1 Sep. 30, 2010

(30) Foreign Application Priority Data

Mar. 24, 2009 (JP) ................................ P2009-072909

(51) Int. Cl.
*H02N 11/00* (2006.01)
*H01L 41/047* (2006.01)

(52) U.S. Cl. ......... 310/800; 310/330; 310/363; 310/364

(58) Field of Classification Search .......... 310/330–332, 310/363, 364, 366, 800
See application file for complete search history.

(56) References Cited

U.S. PATENT DOCUMENTS 7,583,009 B2 * 9/2009 Nagai et al. ................... 310/328
7,696,669 B2 * 4/2010 Kudoh .......................... 310/311
7,733,000 B2 * 6/2010 Kudoh .......................... 310/332
2004/0208993 A1 * 10/2004 Fongalland et al. .......... 427/243
2005/0103706 A1 * 5/2005 Bennett et al. ........... 210/500.27
2006/0199059 A1 * 9/2006 Xu ................................. 429/30
2007/0114116 A1 * 5/2007 Nagai et al. ................... 200/181
2008/0074001 A1 * 3/2008 Ide ................................ 310/330
2010/0164330 A1 * 7/2010 Komatsu et al. .............. 310/365
2010/0244633 A1 * 9/2010 Nagai et al. ................... 310/364
2011/0049404 A1 * 3/2011 Suda ........................ 251/129.01

FOREIGN PATENT DOCUMENTS

JP 10-3348890 A * 12/1998
JP 2004-289994 10/2004
JP 2007-143300 6/2007
JP 2007-328334 12/2007
JP 2008-086185 4/2008
JP 2008-251697 10/2008
JP 2008-252958 * 10/2008
JP 2010-124543 * 6/2010
WO WO-2007/084796 A2 * 7/2007

* cited by examiner

*Primary Examiner* — Thomas M Dougherty
(74) *Attorney, Agent, or Firm* — K&L Gates LLP

(57) ABSTRACT

An actuator includes an ion-conductive polymer layer made of a first ion-conductive polymer, a pair of electrode layers provided one on each side of the ion-conductive polymer layer and made of a second ion-conductive polymer and conductive powder, and ions contained in the ion-conductive polymer layer and electrode layers. The first and second ion-conductive polymers differ in functional group type from each other.

9 Claims, 5 Drawing Sheets

ACTUATOR

CROSS REFERENCES TO RELATED APPLICATIONS

The present application claims priority to Japanese Priority Patent Application JP 2009-072909 filed on Mar. 24, 2009, the entire contents of which is hereby incorporated by reference.

BACKGROUND

The present disclosure relates to a polymer actuator, and more particularly to a polymer actuator which bends or deforms as a result of the migration of ions in response to the electric field applied.

An actuator made of an ion-conductive polymer (ion exchange resin) is drawing attention as a new actuator for its light weight and a large force produced thereby. In general, a polymer actuator has two electrode layers, one on each side of an ion-conductive polymer (ion exchange resin) film. The ion-conductive polymer contains water or other ion conducting medium and ions. In this polymer actuator, when a voltage is applied between the pair of electrodes, the ions migrate in the ion-conductive polymer layer, thus causing the same layer to bend or deform.

However, such a polymer actuator in the past using water as its ion conducting medium is no longer operational when it dries up as a result of the evaporation of water. Therefore, a polymer actuator using an ionic liquid has been proposed (see, for example, Japanese Patent Laid-Open No. 2007-143300, Japanese Patent Laid-Open No. 2007-329334, Japanese Patent Laid-Open No. 2008-86185, Japanese Patent Laid-Open No. 2008-251697, referred to as Patent Documents 1 to 4, respectively, hereinafter). Ionic liquid is a salt in a liquid state at room temperature and non-volatile. Using this liquid eliminates the need for water or other ion conducting medium, thus expanding the range of application of polymer actuators and providing improved reliability.

Further, the polymer actuators described in Patent Documents 1 and 2 have electrode layers formed by coating both sides of the ion-conductive polymer film with a composition. The composition is produced by dispersing carbon powder in an ion-conductive polymer. Forming the electrode layers with an ion-conductive polymer and carbon powder provides improved productivity and reduced manufacturing cost.

However, polymer actuators in the past using an ionic liquid as described in Patent Documents 1 to 4 are slow to deform (operate) and deform in an irregular manner.

In light of the foregoing, it is desired to provide a polymer actuator which is quick to operate and deforms to a large extent.

SUMMARY

The actuator according to an embodiment includes an ion-conductive polymer layer, a pair of electrode layers and ions. The ion-conductive polymer layer is made of a first ion-conductive polymer. The pair of electrode layers is provided one on each side of the ion-conductive polymer layer and made of a second ion-conductive polymer and conductive powder. The ions are contained in the ion-conductive polymer layer and electrode layers. The first and second ion-conductive polymers differ in functional group type from each other.

In the embodiment, the ion-conductive polymer layer and electrode layers differ in functional group type from each other. As a result, the ions are easy to migrate in the ion-conductive polymer layer. The electrode layers expand to a large extent due to repulsive force.

In the present actuator, the first and second ion-conductive polymers may differ in functional group polarity from each other.

If the first ion-conductive polymer has anionic (−) functional groups, and the second ion-conductive polymer cationic (+) functional groups, an ion-conductive polymer having sulfonic groups (—$SO_3H$) or carboxyl groups (—COOH) can be used as the first ion-conductive polymer, and that having quaternary ammonium groups as the second ion-conductive polymer.

Further, an ionic liquid can also be used as the ions.

Still further, carbon powder can also be used as the conductive powder.

Still further, a metal conductive layer may be provided on each of the electrode layers.

In the present embodiment, the ion-conductive polymer layer and electrode layers differ in functional group type from each other. This contributes to higher migration speed of the ions in the ion-conductive polymer layer and a greater repulsive force between the ions in the electrode layers, thus providing a polymer actuator which is quicker to operate and deforms to a larger extent than the actuators in the past.

Additional features and advantages are described herein, and will be apparent from the following Detailed Description and the figures.

BRIEF DESCRIPTION OF THE FIGURES

FIG. 2B illustrates the actuator with no voltage applied thereto;

DETAILED DESCRIPTION

A detailed description will be given below of embodiments with reference to the accompanying drawings. It should be noted that the description will be given in the following order.

1. First embodiment (example in which the ion-conductive polymer layer and electrode layers differ in functional group type from each other)

2. Second embodiment (example in which the ion-conductive polymer layer and electrode layers differ in number of functional groups from each other)

3. Modification example (example in which metal conductive layers are provided)

1. First Embodiment

Overall Configuration

Figure 1:
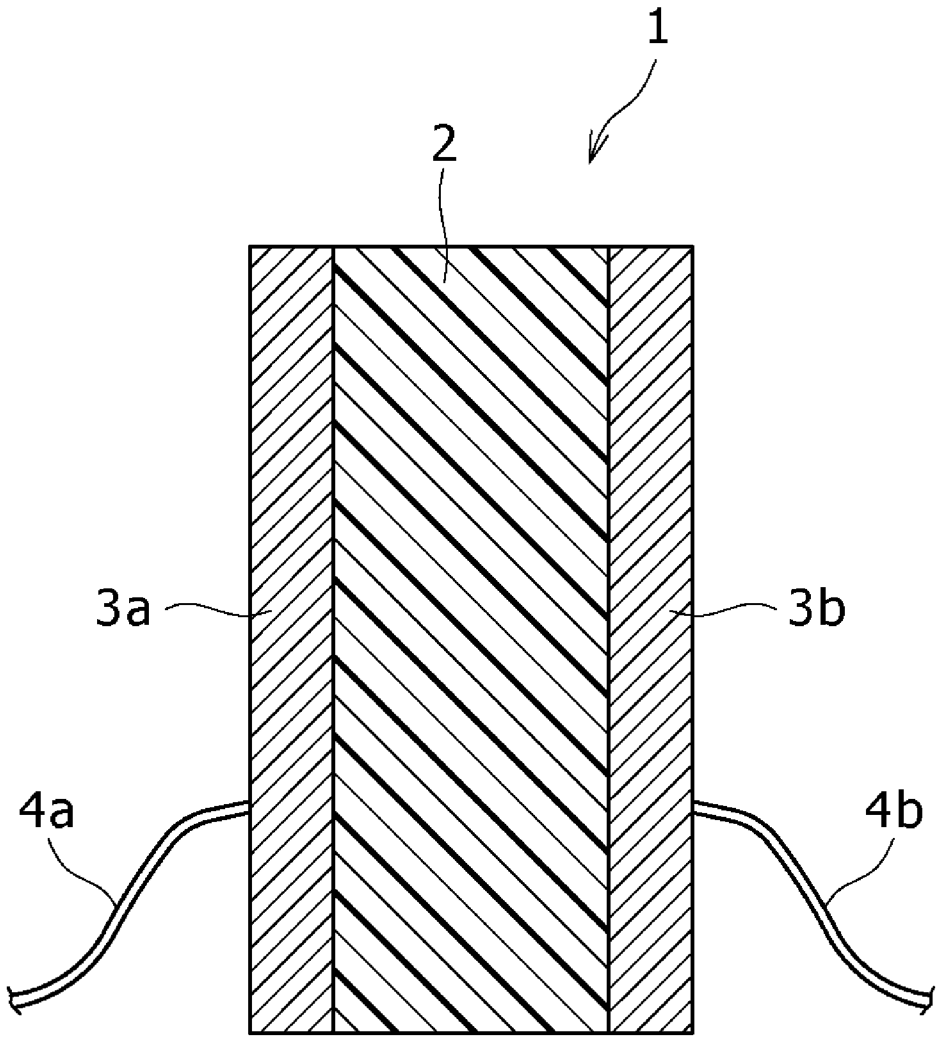
FIG. 1 is a sectional view schematically illustrating the configuration of an actuator according to a first embodiment.

A description will be given first of an actuator according to a first embodiment. FIG. 1 is a sectional view schematically illustrating the configuration of an actuator according to the present embodiment. As illustrated in FIG. 1, an actuator 1 according to the present embodiment includes a pair of electrode layers 3*a* and 3*b* with an ion-conductive polymer layer 2 provided therebetween. The ion-conductive polymer layer 2 and electrode layers 3*a* and 3*b* contain positive and negative ions in such a manner that the ions can migrate according to the electric field applied. On the other hand, lead wires 4*a* and 4*b* are connected respectively to the electrode layers 3*a* and 3*b*. A given voltage is applied between the same layers 3*a* and 3*b* from an external power source (not shown) via the lead wires 4*a* and 4*b*.

[Ion-Conductive Polymer Layer 2]

The ion-conductive polymer layer 2 includes a film or other material made of an ion-conductive polymer which has electrical conductivity caused by the propagation of ions between polymer chains. Among such an ion-conductive polymer are fluorine-based and hydrocarbon-based ion exchange resins. Both negative ion (anionic) and positive ion (cationic) exchange resins can be used for the actuator 1 according to the present embodiment.

For example, if positive ions are present in the ion-conductive polymer layer 2 and electrode layers 3*a* and 3*b*, a positive ion exchange resin or other resin having anionic (−) functional groups should preferably be used as an ion-conductive polymer making up the ion-conductive polymer layer 2. Among such a positive ion exchange resin are polyethylene-based, polystyrene-based, fluorine-based and other resins in which sulfonic groups ($—SO_3H$), carboxyl groups (—COOH) or other anionic (−) groups are incorporated. Above all, a fluorine-based resin having sulfonic or carboxyl groups incorporated therein is suitable.

On the other hand, if negative ions are present in the ion-conductive polymer layer 2 and electrode layers 3*a* and 3*b*, a negative ion exchange resin or other resin having cationic (+) functional groups should preferably be used as an ion-conductive polymer making up the ion-conductive polymer layer 2. Among such a negative ion exchange resin are polyethylene-based, polystyrene-based, fluorine-based and other resins in which cationic (+) groups are incorporated. Above all, a fluorine-based resin having quaternary ammonium groups incorporated therein is suitable.

As described above, a positive ion exchange resin made of a fluorine-based resin having sulfonic or carboxyl groups incorporated therein and a negative ion exchange resin made of a fluorine-based resin having quaternary ammonium groups incorporated therein selectively pass either positive or negative ions. Therefore, using one of these ion exchange resins allows positive or negative ions to migrate faster when a voltage is applied.

It should be noted that the shape of the ion-conductive polymer layer 2 is not limited to the sheet form as shown in FIG. 1. Instead, the same layer 2 may be strip-shaped, disk-shaped, cylindrical or in any other desired shape. Further, the thickness thereof is not particularly limited either and may be determined as appropriate according, for example, to the shape and size of the actuator 1. If the ion-conductive polymer layer 2 is strip-shaped, the same layer 2 should preferably be 30 to 200 μm in thickness.

[Electrode Layers 3*a* and 3*b*]

The electrode layers 3*a* and 3*b* are primarily made of an ion-conductive polymer and conductive powder. The ion-conductive polymer making up the electrode layers 3*a* and 3*b* differs in functional group polarity from that making up the ion-conductive polymer layer 2. Therefore, if the ion-conductive polymer making up the ion-conductive polymer layer 2 has anionic (−) functional groups, that making up the electrode layers 3*a* and 3*b* has cationic (+) functional groups.

As described above, if the ion-conductive polymer making up the ion-conductive polymer layer 2 is opposite in functional group polarity to that making up the electrode layers 3*a* and 3*b*, the ion migration speed in the ion-conductive polymer layer will be enhanced and the electrode layers 3*a* and 3*b* will expand to a larger extent. It should be noted that an ion exchange resin having functional groups such as sulfonic groups, carboxyl groups or quaternary ammonium groups can be used as the electrode layers 3*a* and 3*b* as with the ion-conductive polymer layer 2 described above.

On the other hand, a fine metallic powder including gold (Au), carbon powder or other powder can be used as the conductive powder. Although not particularly limited, the particle size thereof can be, for example, 20 to 50 nm. The smaller the particle size of the conductive powder, the larger the specific surface area per unit volume, and the more ions the powder can attract. As a result, the actuator deforms to a large extent. It should be noted, however, that an excessively small particle size may render it difficult to disperse the powder, resulting in poorer characteristic, instead of better. For example, if carbon powder is used as the conductive powder, the larger the specific surface area thereof, the more ions gather around the powder. Therefore, carbon powder having a large specific surface area such as ketjen black should preferably be used. This provides a large extent of deformation.

It should be noted that the thickness and shape of the electrode layers 3*a* and 3*b* can be determined as appropriate according, for example, to the shape and size of the ion-conductive polymer layer 2 described above. For example, if the ion-conductive polymer layer 2 is 50 μm in thickness, the electrode layers 3*a* and 3*b* can be 10 to 100 μm in thickness.

[Ions]

Among the ions contained in the actuator 1 according to the present embodiment are metal ions, organic ions and ionic liquids. More specifically, among metal ions are sodium, potassium, lithium and magnesium ions. Among organic ions is alkyl ammonium ion. It should be noted that water or other solvent may be required to allow the actuator 1 to contain metal and organic ions. The actuator 1 should preferably be sealed to prevent the volatilization of the solvent.

On the other hand, an ionic liquid is a salt made up of ions (anions or cations). Also called a room temperature molten salt, ionic liquid exhibits characteristics including incombustibility, non-volatility, high ion conductivity and high heat resistance. Among ionic liquids are imidazolium-based, pyridinium-based and aliphatic ionic liquids. If an ionic liquid is used, there is no need for water to be contained in the ion-conductive polymer layer 2. This eliminates the need for evaporation prevention process and enhances the application range of the actuator 1.

[Manufacturing Method]

A description will be given next of a manufacturing method of the actuator 1 according to the present embodiment by taking, as an example, a case in which positive ions are contained. First, conductive powder such as carbon powder is dispersed in a solvent together with an ion-conductive polymer having cationic functional groups to prepare the mixture into a paint form. A volatile solvent which can dissolve an ion-conductive polymer may be used at this time. On the other hand, the dispersion solvent may be prepared by mixing a plurality of solvents. Further, the solvent may be diluted, for example, with ethanol after the dispersion.

On the other hand, the blending ratio between the ion-conductive polymer and conductive powder is not particularly limited, and may be determined as appropriate according, for example, to the shape of the actuator 1, the thicknesses of the ion-conductive polymer layer 2 and electrode layers 3*a* and 3*b* and the conductive powder type. For example, if carbon powder is used, the ion-conductive polymer and carbon powder can be blended in a mass ratio of 1:1 to 1:10.

Next, both sides of the ion-conductive polymer layer 2, made of an ion-conductive polymer having anionic functional groups, are coated with the prepared paint. Then, the solvent is removed from the paint to form the electrode layers 3*a* and 3*b* of a given thickness. At this time, the coating method is not particularly limited, and a publicly known method may be used including roll coating, spray coating, dipping and screen printing. On the other hand, the ion-conductive polymer layer 2 may be coated with the paint in a plurality of steps. In this case, the functional group type of the ion-conductive polymer may be changed from one layer to another. This produces a gradient distribution of the ions in the electrode layers 3*a* and 3*b*.

It should be noted that the method of forming the electrode layers is not limited to coating with a paint containing conductive powder, and a variety of other methods are also applicable. For example, the electrode layers 3*a* and 3*b* can be formed by stacking sheets (films) on the ion-conductive polymer layer 2. The sheets are made of an ion-conductive polymer and conductive powder.

Next, the ion-conductive polymer layer 2 and electrode layers 3*a* and 3*b* are caused to contain positive ions. More specifically, the electrode layers 3*a* and 3*b* formed one on each side of the ion-conductive polymer layer 2 are immersed in an aqueous solution, ionic liquid or other solution containing positive ions, thus impregnating the same layers 2, 3*a* and 3*b* with positive ions.

[Operation]

Figure 2A:
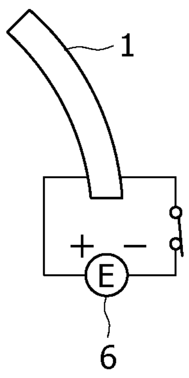
FIGS. 2A to 2C are diagrams schematically illustrating the operation of an actuator shown in FIG. 1, and FIGS. 2A and 2C illustrate the actuator with a voltage applied thereto.
Figure 2B:
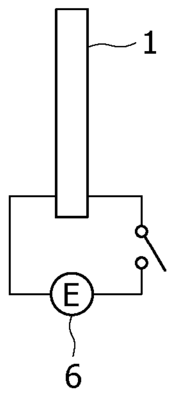
Figure 2C:
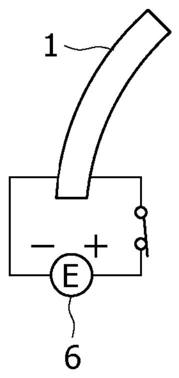

A description will be given next of the operation of the actuator 1 according to the present embodiment by taking, as an example, a case in which positive ions are contained. FIGS. 2A to 2C are diagrams schematically illustrating the operation of the actuator 1 shown in FIG. 1. FIGS. 2A and 2C illustrate the actuator 1 with a voltage applied thereto. FIG. 2B illustrates the actuator with no voltage applied thereto. On the other hand, FIGS. 3A to 3C are schematic diagrams illustrating the operating principle of the actuator 1 shown in FIG. 1 in the order of steps.

As illustrated in FIG. 2B, the actuator 1 according to the present embodiment is upright when no voltage is applied because the ions are evenly distributed therein. As illustrated in FIGS. 2A and 2C, on the other hand, when a voltage is applied between the electrode layers from an external power source 7 (not shown), the ions migrate to one of the electrode layers according to the polarity of the voltage applied. For example, if positive ions are contained in the actuator 1, the ions gather in the negative electrode layer, whereas the ions diminish in number in the positive electrode layer. This difference in concentration caused by uneven distribution gives rise to a volume difference between the two electrode layers, bending (deforming) the actuator 1.

Figure 3A:
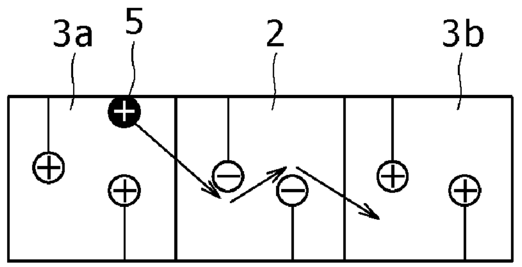
FIGS. 3A to 3C are schematic diagrams illustrating the operating principle of the actuator shown in FIG. 1 in the order of steps.

For example, when a positive potential is applied to the electrode layer 3*a*, and a negative potential to the electrode layer 3*b* as illustrated in FIG. 3A, a positive ion 5 in the electrode layer 3*a* migrates to the electrode layer 3*b* by way of the ion-conductive polymer layer 2. At this time, if the electrode layer 3*a* has cationic functional groups, and the ion-conductive polymer layer 2 has anionic functional groups, the positive ion 5 is attracted by the anionic functional groups of the ion-conductive polymer layer 2 rather than the cationic functional groups of the electrode layer 3*a* which are opposite in polarity to the anionic functional groups of the ion-conductive polymer layer 2. This permits easier passage of the positive ion 5 through the ion-conductive polymer layer 2, thus providing higher operating speed of the actuator 1.

Figure 3B:
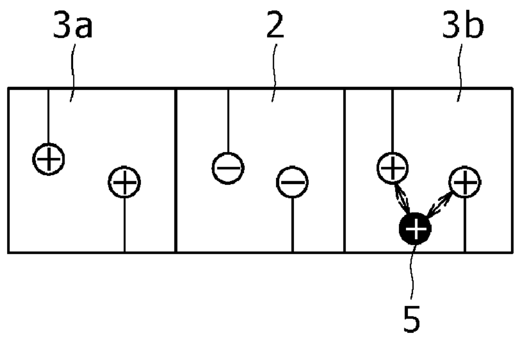
Figure 3C:
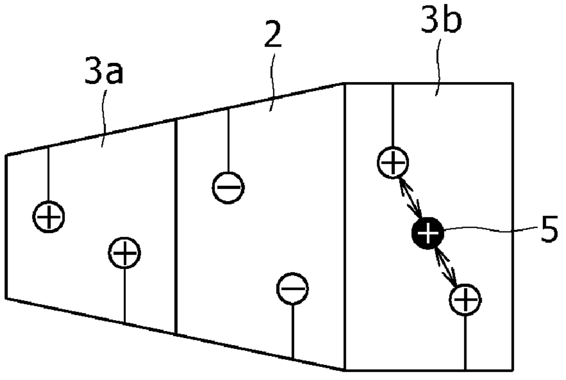

On the other hand, if the electrode layer 3*b* has cationic functional groups as illustrated in FIGS. 3B and 3C, a repulsive force develops between the positive ion 5 which has reached the electrode layer 3*b* and the cationic functional groups which are of the same polarity as the positive ion 5, thus causing the electrode layer 3*b* to expand more. This allows for the electrode layer 3*b* to deform (bend) to a larger extent.

It should be noted that if negative ions are contained in the actuator, or if a potential of reversed polarity is applied between the electrode layers 3*a* and 3*b*, the actuator 1 bends in the opposite direction to that shown in FIGS. 2A and 2C. Further, the bending direction of the actuator 1 can be readily controlled by switching the polarity of the voltage applied.

As described above, the functional groups adapted to repel the ions are incorporated in the electrode layers of the actuator according to the present embodiment. This provides a large volume change (expansion). On the other hand, the functional groups having excellent affinity for the ions are incorporated in the ion-conductive polymer layer. This permits easy migration of the ions, thus contributing to a higher migration speed thereof. As a result, it is possible to achieve a polymer actuator which is quick to operate and deforms to a large extent.

It should be noted that, in the actuator according to the present embodiment, the ion-conductive polymer of the ion-conductive polymer layer is opposite in polarity to that of the electrode layers. However, the present invention is not limited thereto and applicable as long as the ion-conductive polymer layer and electrode layers differ in functional group type from each other. For example, the same effect can be achieved if the functional groups of the ion-conductive polymer layer and electrode layers differ, for example, in repulsive force against or affinity for the ions despite being identical in polarity.

2. Second Embodiment

Overall Configuration

A description will be given next of the actuator according to a second embodiment. The actuator according to the present embodiment is identical to that according to the first embodiment except in that the ion-conductive polymer layer and electrode layers differ in number of functional groups from each other.

[Ion-Conductive Polymer and Electrode Layers]

An ion-conductive polymer making up the ion-conductive polymer layer and electrode layers may contain anionic or cationic functional groups. However, if positive ions are present in the actuator, a positive ion exchange resin or other resin having anionic functional groups should preferably be used as an ion-conductive polymer making up the ion-conductive polymer layer and electrode layers. On the other hand, if negative ions are present in the actuator, a negative ion exchange resin or other resin having cationic functional groups should preferably be used as an ion-conductive polymer making up the ion-conductive polymer layer and electrode layers.

As for the number of functional groups, on the other hand, the ion-conductive polymer layer should preferably have more functional groups than the electrode layers. This permits easy migration of the ions between the functional groups. It should be noted that the term "number of functional groups" refers to the number represented by the number of functional groups per unit mass or equivalent weight (EW). On the other hand, the aforementioned effect can be achieved as long as there is a difference in number of functional groups between the ion-conductive polymer layer and electrode layers, however the slight the difference may be.

[Manufacturing Method]

The actuator according to the present embodiment can be manufactured by the same method as for the actuator according to the first embodiment. In order to manufacture an actuator containing positive ions, for example, it may be necessary to first disperse conductive powder in a solvent together with an ion-conductive polymer having anionic functional groups to prepare the mixture into a paint form, and then coat both sides of the ion-conductive polymer layer, made of an ion-conductive polymer having anionic functional groups, with the prepared paint.

At this time, the electrode layers must be smaller in number of functional groups than the ion-conductive polymer layer. For example, if an ion-conductive polymer film having sulfonic groups and whose number of functional groups EW is about 700 g/meq is used as the ion-conductive polymer layer, the electrode layers must contain an ion-conductive polymer, whose number of functional groups EW is 1100 g/meq or so, and carbon powder at a 1:1 ratio. It should be noted that the blending ratio between the ion-conductive polymer and conductive powder is not particularly limited, and may be determined as appropriate according, for example, to the conductive powder type and the number of functional groups in the ion-conductive polymer layer.

Further, the method of forming the electrode layers is not limited to coating with a paint containing conductive powder. For example, the electrode layers may be formed by stacking sheets (films) on the ion-conductive polymer layer. The sheets are made of an ion-conductive polymer and conductive powder. In this case, each of the electrode layers may be multi-layered so that a gradient distribution of the number of functional groups can be produced in the electrode layers by changing the number of functional groups from one layer to another of each of the electrode layers.

[Operation]

Figure 4A:
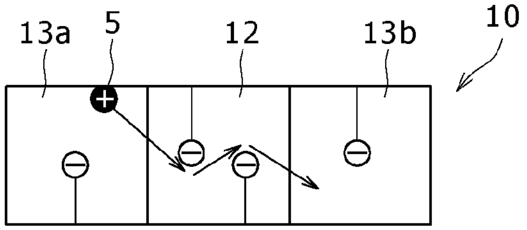
FIGS. 4A to 4C are schematic diagrams illustrating the operating principle of the actuator according to a second embodiment in the order of steps.
Figure 4B:
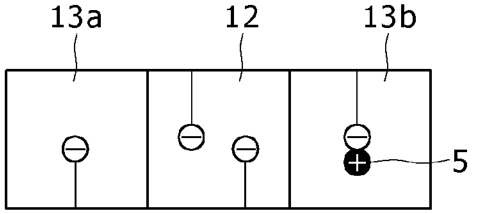
Figure 4C:
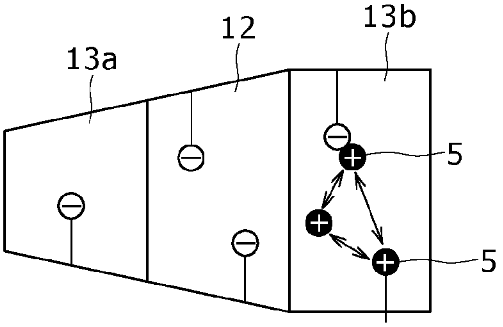

A description will be given next of the operation of the actuator according to the present embodiment by taking, as an example, a case in which positive ions are contained. FIGS. 4A to 4C are schematic diagrams illustrating the operating principle of the actuator according to the present embodiment in the order of steps. As with the actuator 1 according to the first embodiment, an actuator 10 according to the present embodiment is upright when no voltage is applied because the ions are evenly distributed therein. On the other hand, when a voltage is applied between the electrode layers from an external power source (not shown), the ions migrate to one of the electrode layers according to the polarity of the voltage applied. This difference in concentration caused by uneven distribution gives rise to a volume difference between the two electrode layers, bending (deforming) the actuator 10.

At this time, when, for example, a positive potential is applied to an electrode layer 13*a*, and a negative potential to an electrode layer 13*b* as illustrated in FIG. 4A, the positive ion 5 in the electrode layer 13*a* migrates to the electrode layer 13*b* by way of an ion-conductive polymer layer 12. At this time, if the ion-conductive polymer layer 12 has more functional groups than the electrode layer 13*a*, the positive ion 5 can migrate with ease from one functional group to another. This permits easy passage of the positive ion 5 through the ion-conductive polymer layer 12, thus providing higher operating speed of the actuator.

Next, the positive ion 5 which has reached the electrode layer 13*b* and the functional group in the same layer 13*b* attract each other because they differ in polarity as illustrated in FIG. 4B. Then, in the electrode layer 13*b* with a small number of functional groups, a large repulsive force develops between the positive ions 5 which have reached the same layer 13*b*, causing the same layer 13*b* to expand more because of increased number of ions. This contributes to increased deformation (bending) of the actuator 10.

On the other hand, if positive and negative ions are contained in the actuator 10, the deformation by positive ions may be hindered by the migration of the negative ions. In the actuator 10, however, a large number of functional groups identical in polarity to the negative ions are incorporated in the ion-conductive polymer layer 12. This makes it difficult for the negative ions to migrate in the same layer 12, thus preventing the reduction in deformation.

Further, if the applied voltage level is set lower than the level at which the negative ions can pass the ion-conductive polymer layer 12, the impact of negative ions can be eliminated, thus making it possible to determine the extent to which the actuator will deform based on the positive ions. As a result, when a given voltage is applied to the actuator, the deformation will exhibit a simple increasing tendency. This provides not only increased deformation but also improved deformation speed.

It should be noted that if a potential of reversed polarity is applied between the electrode layers 13*a* and 13*b*, the positive ions 5 will migrate in the opposite direction, that is, the actuator 10 will bend in the opposite direction. On the other hand, if the actuator bends or deforms because of the migration of negative ions, the same effect can be achieved by using an ion-conductive polymer having cationic functional groups such as quaternary ammonium groups.

In the actuator according to the present embodiment, the functional groups opposite in polarity to the ions contributing to the deformation are incorporated in the ion-conductive polymer layer and electrode layers. In addition, the ion-conductive polymer layer has more such functional groups than the electrode layers. This permits easy migration of the ions in the ion-conductive polymer layer, thus contributing to higher migration speed of the ions in the ion-conductive polymer layer. This provides higher operating speed of the actuator. Further, the electrode layers have a small number of functional groups. As a result, a large repulsive force develops between the ions, thus contributing to increased deformation. This provides a polymer which is quick to operate and deforms to a large extent.

It should be noted that the actuator according to the present embodiment is identical to that according to the first embodiment in all respects other than the above configuration, operation and effect.

3. Modification Example

Figure 5:
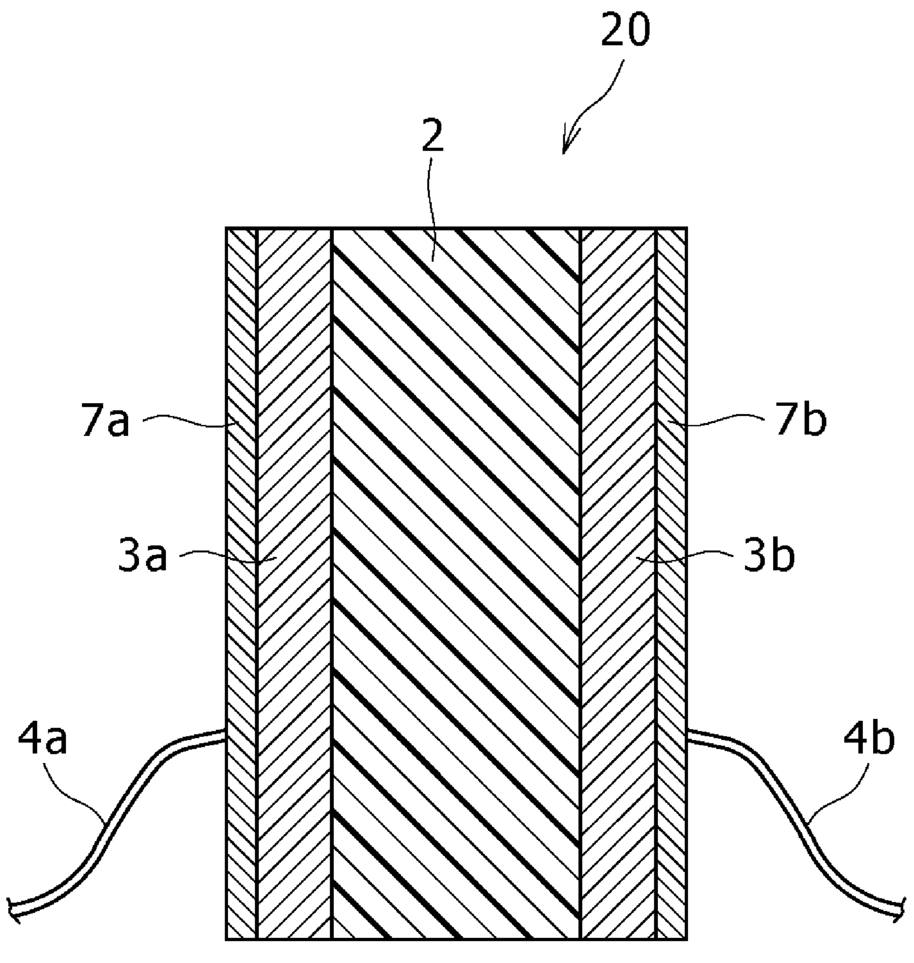
FIG. 5 is a sectional view schematically illustrating the configuration of the actuator according to a modification example.

A description will be given next of the actuator according to a modification example of the first and second embodiments. FIG. 5 is a sectional view schematically illustrating the configuration of the actuator according to the modification example. It should be noted that like components as those shown in FIG. 1 are denoted by the same reference numerals, and a detailed description thereof will be omitted. As illustrated in FIG. 5, an actuator 20 according the present modification example includes the pair of electrode layers 3*a* and 3*b* with the ion-conductive polymer layer 2 provided therebetween. Metal conductive layers 7*a* and 7*b* are formed respectively on the electrode layers 3*a* and 3*b*. In the actuator 20, the lead wires 4*a* and 4*b* are connected respectively to the metal conductive layers 7*a* and 7*b*. A given voltage is applied between the electrode layers 3*a* and 3*b* from an external power source (not shown) via the lead wires 4*a* and 4*b*.

[Metal Conductive Layers 7*a* and 7*b*]

The metal conductive layers 7*a* and 7*b* can be formed with a highly conductive and oxidation-resistant metallic material such as gold or platinum. The thickness of the same layers 7*a* and 7*b* is not particularly limited. However, it is preferred that these layers be of a thickness to provide a continuous film so that the voltage from the lead wires 4*a* and 4*b* is applied evenly over the electrode layers 3*a* and 3*b*. Therefore, it is more preferred that the metal conductive layers 7*a* and 7*b* be of a thickness to provide a surface resistance of 1Ω or less. On the other hand, the method of forming the metal conductive layers 7*a* and 7*b* is not particularly limited, and a publicly known method may be used including plating, vapor deposition and sputtering.

In the actuator 20 according to the present modification example, the metal conductive layers 7*a* and 7*b* are provided respectively on the electrode layers 3*a* and 3*b*. As a result, the surface resistance is sufficiently low, thus allowing for the voltage to be applied evenly over the entire actuator, thus causing the entire actuator to bend evenly.

Although, in the present modification example, a case has been described in which the metal conductive layers 7*a* and 7*b* are provided in the actuator 1 according to the first embodiment shown in FIG. 1, it is a matter of course that the same effect can be achieved when the same layers 7*a* and 7*b* are provided in the actuator according to the second embodiment. It should be noted that the actuator according to the present modification example is identical to those according to the first and second embodiments in all respects other than the above configuration, operation and effect.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An actuator comprising:

an ion-conductive polymer layer comprising a first ion-conductive polymer;

a pair of electrode layers provided one on each side of the ion-conductive polymer layer and comprising a second ion-conductive polymer and conductive powder; and ions contained in the ion-conductive polymer layer and electrode layers, wherein the first and second ion-conductive polymers differ in functional group type and functional group polarity from each other.

2. The actuator according to claim 1, wherein the first ion-conductive polymer has anionic functional groups, and the second ion-conductive polymer has cationic functional groups.

3. The actuator according to claim 2, wherein the first ion-conductive polymer has sulfonic groups or carboxyl groups.

4. The actuator according to claim 2, wherein the second ion-conductive polymer has quaternary ammonium groups.

5. The actuator according to claim 1, wherein the ions are an ionic liquid.

6. The actuator according to claim 1, wherein the conductive powder is carbon powder.

7. The actuator according to claim 1, wherein a metal conductive layer is provided on each of the electrode layers.

8. The actuator according to claim 1, wherein the ion-conductive polymer layer and the electrode layers differ in numbers of functional groups from each other per unit mass or equivalent weight.

9. The actuator according to claim 8, wherein the ion-conductive polymer layer includes a greater number of functional groups per unit mass or equivalent weight than the in the electrode layers.

* * * * *